United States Patent
Lau et al.

(12)

(10) Patent No.: US 6,294,402 B1
(45) Date of Patent: Sep. 25, 2001

(54) METHOD FOR ATTACHING AN INTEGRATED CIRCUIT CHIP TO A SUBSTRATE AND AN INTEGRATED CIRCUIT CHIP USEFUL THEREIN

(75) Inventors: James Chung-Kei Lau, Torrance; Geoffrey Pilkington, Simi Valley, both of CA (US)

(73) Assignee: TRW Inc., Redondo Beach, CA (US)

( * ) Notice: Subject to any disclaimer, the term of this patent is extended or adjusted under 35 U.S.C. 154(b) by 0 days.

(21) Appl. No.: 09/327,772

(22) Filed: Jun. 7, 1999

(51) Int. Cl.[7] .................... H01L 21/44; H01L 21/48; H01L 21/50
(52) U.S. Cl. .................. 438/106; 438/121; 438/125
(58) Field of Search .................. 438/106, 121, 438/125

(56) References Cited
U.S. PATENT DOCUMENTS

| | | | |
|---|---|---|---|
| 3,802,065 | * | 4/1974 | Vosburgh . |
| 5,027,997 | * | 7/1991 | Bendik et al. . |
| 5,089,439 | * | 2/1992 | Lippey . |
| 5,156,998 | * | 10/1992 | Chi et al. . |
| 5,470,787 | * | 11/1995 | Greer . |
| 5,668,033 | * | 9/1997 | Ohara et al. . |

* cited by examiner

*Primary Examiner*—John F. Niebling
*Assistant Examiner*—Josetta I. Jones
(74) *Attorney, Agent, or Firm*—Antonelli, Terry, Stout & Kraus, LLP

(57) ABSTRACT

An integrated circuit chip (10) includes a substrate (12), a plurality of transistors (16) provided in the substrate (12), a circuit pattern (14) provided on a top surface of the substrate (12) and a metal layer (42) comprising at least two metals in substantially eutectic proportions provided on a bottom surface of the substrate, the bottom surface of the metal layer (42) being exposed. The integrated circuit chip (10) can be attached to a further substrate, e.g., a housing, using automated attachment techniques. The chip (10) can be attached to the housing by picking up the integrated circuit chip (10) with the metal layer (42) provided on the bottom surface thereof and placing the integrated circuit chip (10) onto a housing so the bottom surface of the integrated circuit chip (10) faces the housing with the metal layer (42) there between; and then heating the metal layer (42) to a temperature above its eutectic temperature to melt the metal layer and attach the integrated circuit chip (10) to the housing.

24 Claims, 1 Drawing Sheet

METHOD FOR ATTACHING AN INTEGRATED CIRCUIT CHIP TO A SUBSTRATE AND AN INTEGRATED CIRCUIT CHIP USEFUL THEREIN

BACKGROUND OF THE INVENTION

The present invention relates to a method for attaching an integrated circuit chip to a substrate, e.g., a housing or other next level structure, and an integrated circuit chip useful in such a method. In particular, the method is useful for attaching a high power integrated circuit, e.g., a microwave monolithic integrated circuit (MMIC) to a housing.

Integrated circuit chips can be attached to a housing using a manual eutectic attachment technique. In such a technique, a eutectic material preform, e.g., a gold-tin eutectic material preform, is provided between the integrated circuit chip and the housing. Scrubbing is generally required for the component attachment and there has been a lack of eutectic material flow control when using a manual eutectic attachment technique. In addition, most gold-tin eutectic attachments are performed with gold-tin preforms and gold plated surfaces. The gold from the gold plated surface tends to diffuse into the preform. The resultant gold rich composition causes the rework temperature to increase.

Integrated circuits, e.g., high power integrated circuits, can be attached to a housing or other next level structure by an automated assembly system using an epoxy adhesive. However, the thermal conductivity of the epoxy material which is used to attach the integrated circuits, especially GaAs or InP integrated circuits, with the automated assembly is about one tenth the thermal conductivity of a eutectic material, e.g., gold-tin, gold-germanium, tin-lead. Heat generated by high power integrated circuits, e.g., MMIC's, must be removed to keep the operation temperature compatible with the device limitation. The lower thermal conductivity of the epoxy adhesive limits the device power or increases the operation temperature.

SUMMARY OF THE INVENTION

Applicants have found that there is a need to replace the low thermal conductivity adhesive with a better thermal conductivity material to enhance heat dissipation and enable high power output. There is also a need to provide a method for attaching an integrated circuit chip to a substrate with a method which is susceptible to automated assembly systems.

The invention provides an integrated circuit chip which includes a substrate, a plurality of transistors provided in the substrate, a circuit pattern provided on a top surface of the substrate and a metal layer comprising at least two metals in substantially eutectic proportions provided on a bottom surface of the substrate, the bottom surface of the metal layer being exposed. The integrated circuit chip can be attached to a further substrate, e.g., a housing, using automated attachment techniques. The chip can be attached to the housing by picking up the integrated circuit chip with the metal layer provided on the bottom surface thereof and placing the integrated circuit chip, e.g., under programmed control, onto a housing so the bottom surface of the integrated circuit chip faces the housing with the metal layer there between; and then heating the metal layer to a temperature above its eutectic temperature to melt the metal layer and attach the integrated circuit chip to the housing.

The metal layer can be provided on the bottom surface of the integrated circuit chip by depositing at least one layer of each of the at least two metals and inter diffusing the at least two metals, e.g., in an inert atmosphere to a temperature below the melting point of the metals and at or above a temperature sufficient to inter diffuse the at least two metals. In order to economically deposit the metal layer, especially when larger thicknesses are required, e.g., up to 3.0 mil, the layer can be provided by plating at least one layer of each of the at least two metals on the bottom surface of the integrated circuit chip and inter diffusing the at least two metals. Alternatively, they can be simultaneously plated or vacuum deposited.

The housing is preferably made of a material, e.g., AlSiC, having a coefficient of thermal expansion close to that of the integrated circuit chip. The present invention is especially applicable to high power integrated circuit chips, e.g., microwave monolithic integrated circuits, e.g., those made of GaAs or InP, which generate considerable heat which, according to the present invention, can be conducted away from the chip through the eutectic material.

The eutectic material can be, e.g., a gold-tin eutectic. When the housing has a gold layer on a surface to which the integrated circuit chip is attached, the eutectic layer, as deposited, can be slightly tin rich (e.g., gold:tin ratio of 78:22) in order to accommodate diffusion of gold from the housing surface to provide the eutectic proportions (80:20). A metal barrier layer, e.g., nickel for preventing diffusion of materials from said integrated circuit chip into the eutectic metal layer is preferably provided on the back surface of the chip.

The chip is attached to the housing by heating the metal layer to a temperature above its eutectic temperature, e.g., by heating the metal layer to a temperature 30–55° C. above its eutectic temperature in an inert atmosphere. No scrubbing is required.

DETAILED DESCRIPTION OF THE PREFERRED EMBODIMENTS

Figure 1:
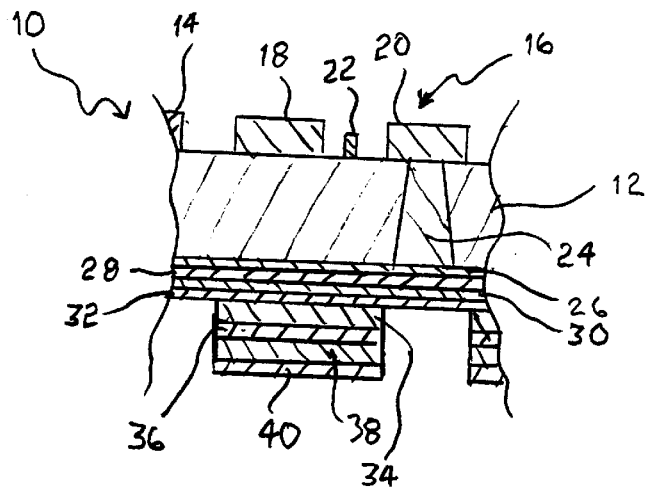
FIG. 1 is a schematic cross-sectional view showing a non-limitative example of a portion of an integrated circuit chip according to the present invention.

FIG. 1 is a schematic cross-sectional view showing a portion of an integrated circuit chip of the present invention which can be used in a reworkable automated eutectic attachment system. FIG. 1 shows a portion of an integrated circuit chip 10, e.g, a high power integrated circuit chip, e.g., a microwave monolithic integrated circuit (MMIC). The chip 10 includes a substrate 12, e.g., made of GaAs or InP. The chip 10 has a top side circuit 14, a portion of which is shown in FIG. 1. The chip 10 also includes a plurality of transistors, one transistor 16 being shown in FIG. 1 and including a drain 18 and source 20 and a gate 22. A via 24 is provided in the substrate 12. Metalization is provided on the bottom side of the chip 10. In this case, the metalization includes a titanium adhesion layer 26, a tungsten barrier layer 28 and a gold conductive layer 30.

A nickel under-plate layer 32 is provided to prevent gold leaching and eutectic flow as will be described hereinafter.

On the bottom surface of the nickel under-plate, a spacer layer 34, e.g., made of nickel, is provided, e.g., by plating. The function of the spacer layer 34 will be described hereinafter. The eutectic material is deposited on the spacer 34, e.g., by plating. A photolithographic determined pattern (with the use of a photoresist) is used to define the plating area. In the embodiment shown in FIG. 1, the metals making up the eutectic material are deposited in layers. More specifically, in the embodiment shown in FIG. 1, a gold metal 36 is deposited, a tin layer 38 and a second gold layer 40. The layers are preferably deposited by plating, since plating can be economically used to provide thicker layers. Other deposition techniques, e.g., vacuum deposition, can also be used. Vacuum deposition techniques are preferably used for providing thinner layers, e.g., for smaller components. Vacuum deposition allows deposition of materials which cannot be plated, e.g., gold-germanium.

Figure 2:
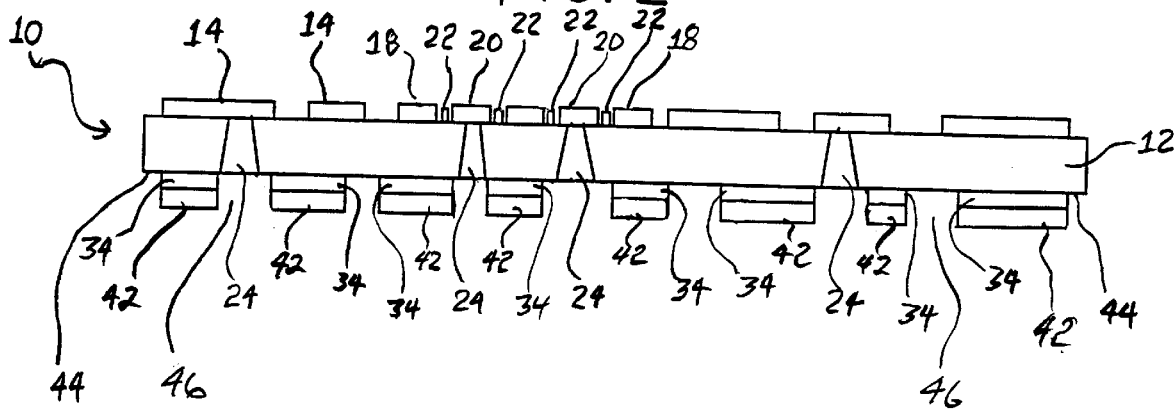
FIG. 2 is a schematic cross-sectional view showing a non-limitative example of an integrated circuit chip according to the present invention prior to its attachment to a housing or next level structure.

The plated gold layer 36, tin layer 38 and gold layer 40 are then interdiffused by heating in an inert atmosphere at a temperature lower than the melting temperature of the separate elements. For example, for gold and tin, the layers can be heat treated for approximately three hours at 220° C. The heat treatment causes the plated gold surface to change color (from gold to metallic gray). The heat treatment can be conducted under any inert atmosphere, e.g., nitrogen. The melting temperature of the composite structure (280° C.) is higher than the melting temperature of tin (232° C). FIG. 2 shows the chip 10 after interdiffusion of the metals, e.g., gold and tin, whereby the chip 10 has a metal layer 42 comprising the metals, gold and tin, in substantially eutectic proportions on a bottom surface of the chip 10. The bottom side metalization (titanium layer 26, tungsten barrier 28, gold conductive layer 30 and nickel under plate 32) on the bottom side of the chip 10 is not shown in FIG. 2 but would cover all areas of the chip 10 except the edge set back portions 44.

The chip 10 with the integral eutectic metal layer 42 is picked up by an automated assembly tool, e.g., model 3500 automated assembly machine sold by Palamar of Carlsdad, Calif. The automated assembly tool picks up the chip 10 and places it, e.g., on a hot plate with a covering inert gas, e.g., nitrogen. The hot plate temperature is set up to be about 40 to 60° C. above the eutectic temperature. The attachment surface temperature is 30 to 55° C. above the eutectic temperature. The circuit pattern 14 on the component allows the automated assembly machine to precisely pick and place the component within 0.0005 inches of the target location.

The plating pattern provided by the spacer pattern 34, in combination with the thickness of the eutectic metal layer 42 is designed so that the volume of the eutectic metal layer 42 is approximately equal to the volume (space) of the channels 46 formed between the pattern of spacers 34. The channels 46 are areas that are not plated with spacer material 34. Since eutectic material which flows away from the chip 10 can short out circuits and prevent other components from being placed, the channels 46 are designed to accommodate the molten eutectic material within the perimeter of the chip 10 so that the molten eutectic material does not flow away excessively from the chip 10. The spacers 34 are provided in the areas that have a need for thermal conduction. The spacers 34 can also control the bond line minimum thickness and can support all bonding pads.

The housing or next level structure to which the chip 10 is attached is preferably made of a material, e.g., AlSiC, having a coefficient of thermal expansion close to that of the integrated circuit chip. In the case of MMIC chips made of GaAs or InP, it is preferred that the material of the housing have a coefficient of thermal expansion less than 10 PPM/° C. Since the housing surface would typically have a gold layer thereon, it is preferred that the eutectic metal layer 42, as deposited, is made slightly gold deficient, i.e., slightly tin rich, e.g., gold:tin ratio of 78:22, in order to accommodate diffusion of gold from the housing surface to provide the eutectic proportions (80:20). This will ensure that reworking can be conducted at the eutectic temperature.

The under plate layer 32, e.g., nickel, prevents the components backside gold plating 30 from diffusing or dissolving in the molten eutectic material during the attachment process.

While the metal layer 42 has been described as a gold-tin eutectic metal layer, other materials can be used as long as the material has a melting point within the range of about 50 to 400° C. Since it is preferable that the material have a limited, precise melting point, eutectic materials are preferred, e.g., gold-tin, gold-geranium, tin-lead.

The thickness of the metal layer 42 depends on the type of chip, but is preferably in the range of 0.1 to 3.0 mil, more preferably 0.5 to 1.0 mil, especially in the case of MMIC chips. While minimum eutectic material thickness can minimize thermal impedance, the volume of the eutectic material must be sufficient to fill the space between two poorly matched surfaces. A 0.5 mil thick metal layer 42 should be sufficient for surface roughness of up to 40 micro inches.

It is preferable that picking up of the integrated circuit chip 10 with the metal layer 42 provided thereon and placing the integrating circuit chip 10 onto a housing or other next level structure be accomplished using an automated assembly machine under programmed control. Such automated assembly machines are known in the art. Satisfactory results have been obtained using a Palomar Model 3500 machine. Applicants have previously used the Palomar Model 3500 for accurate placement of chips using epoxy adhesive. Applicants have modified the Palomar Model 3500 machine to operate at higher temperatures to achieve attachment using the eutectic metal layer. While the Palomar Model 3500 is able to apply scrubbing action to the components, applicants have found that component surface damage, e.g., scratches, can occur. Therefore, scrubbing is neither recommended nor required.

We claim:

1. A method for attaching an integrated circuit chip to a substrate, comprising the steps of:

providing an integrated circuit chip;

providing a metal layer comprising at least two metals in substantially eutectic proportions on a bottom surface of the integrated circuit chip;

picking up the integrated circuit chip with the metal layer provided on the bottom surface thereof and placing the integrated circuit chip onto a substrate so the bottom surface of the integrated circuit chip faces the substrate with the metal layer there between; and heating the metal layer to a temperature above its eutectic temperature to melt the metal layer and attach the integrated circuit chip to the substrate.

2. A method according to claim 1, wherein the step of providing the metal layer comprising at least two metals in substantially eutectic proportions on the bottom surface of the integrated circuit chip comprises the steps of depositing at least one layer of each of the at least two metals and inter-diffusing the at least two metals.

3. A method according to claim 2, wherein the step of inter diffusing the at least two metals comprises heating the at least one layer of each of the at least two metals in an inert atmosphere to a temperature below the melting point of the metals and at or above a temperature sufficient to inter diffuse the at least two metals.

4. A method according to claim 2, wherein the step of depositing at least one layer of each of the at least two metals comprises plating at least one layer of each of the at least two metals on the bottom surface of the integrated circuit chip.

5. A method according to claim 2, wherein the step of depositing at least one layer of each of the at least two metals comprises vacuum depositing at least one layer of each of the at least two metals on the bottom surface of the integrated circuit chip.

6. A method according to claim 1, wherein the step of providing the metal layer comprising at least two metals in substantially eutectic proportions on the bottom surface of the integrated circuit chip comprises simultaneously depositing the at least two metals in substantially eutectic proportions.

7. A method according to claim 1, wherein the substrate is a housing.

8. A method according to claim 7, wherein the housing is made of a material having a coefficient of thermal expansion close to that of the integrated circuit chip, and wherein the housing has a gold layer on a surface to which the integrated circuit chip is attached.

9. A method according to claim 8, wherein the step of providing the metal layer comprising at least two metals in substantially eutectic proportions on the bottom surface of the integrated circuit chip comprises depositing gold and tin in substantially eutectic proportions on the bottom surface of the integrated circuit chip.

10. A method according to claim 9, wherein the step of providing the metal layer comprising at least two metals in substantially eutectic proportions on the bottom surface of the integrated circuit chip comprises the steps of depositing at least one layer of each of gold and tin and inter diffusing the layers of gold and tin.

11. A method according to claim 10, wherein, in the step of depositing at least one layer of each of gold and tin, a weight ratio of gold:tin is about 78:22.

12. A method according to claim 1, wherein the step of providing the metal layer comprising at least two metals in substantially eutectic proportions on the bottom surface of the integrated circuit chip comprises depositing gold and tin in substantially eutectic proportions on the bottom surface of the integrated circuit chip.

13. A method according to claim 12, wherein the step of providing the metal layer comprising at least two metals in substantially eutectic proportions on the bottom surface of the integrated circuit chip comprises the steps of depositing at least one layer of each of gold and tin and inter diffusing the layers of gold and tin.

14. A method according to claim 1, wherein the step of providing the metal layer comprising at least two metals in substantially eutectic proportions on the bottom surface of the integrated circuit chip comprises depositing the at least two metals by plating and wherein a thickness of the metal layer is 0.1–3.0 mil.

15. A method according to claim 1, wherein the step of providing the metal layer comprising at least two metals in substantially eutectic proportions on the bottom surface of the integrated circuit chip comprises depositing the at least two metals by plating and wherein a thickness of the metal layer is about 0.5–1.0 mil.

16. A method according to claim 1, wherein the step of heating the metal layer to a temperature above its eutectic temperature comprises heating the metal layer to a temperature 30–55° C. above its eutectic temperature.

17. A method according to claim 1, wherein the step of heating the metal layer to a temperature above its eutectic temperature comprises heating the metal layer to a temperature 30–55° C. above its eutectic temperature in an inert atmosphere.

18. A method according to claim 1, wherein the step of providing the metal layer comprising at least two metals in substantially eutectic proportions on the bottom surface of the integrated circuit chip comprises providing the metal layer on a barrier layer for preventing diffusion of materials from said integrated circuit chip into the metal layer.

19. A method according to claim 18, wherein the barrier layer comprises nickel.

20. A method according to claim 1, wherein the integrated circuit chip is a high power integrated circuit chip.

21. A method according to claim 20, wherein the high power integrated circuit chip comprises GaAs or InP and the substrate comprises AlSiC.

22. A method according to claim 20, wherein the high power integrated circuit chip is a microwave monolithic integrated circuit chip.

23. A method according to claim 1, wherein the step of picking up the integrated circuit chip with the metal layer provided on the bottom surface thereof and placing the integrated circuit chip onto the substrate is accomplished using an automated assembly machine.

24. A method according to claim 1, wherein the step of picking up the integrated circuit chip with the metal layer provided on the bottom surface thereof and placing the integrated circuit chip onto the substrate is done under programmed control.

* * * * *